(12) United States Patent
Mustafa et al.

(10) Patent No.: US 11,387,134 B2
(45) Date of Patent: Jul. 12, 2022

(54) PROCESS KIT FOR A SUBSTRATE SUPPORT

(71) Applicant: APPLIED MATERIALS, INC., Santa Clara, CA (US)

(72) Inventors: Muhannad Mustafa, Santa Clara, CA (US); Muhammad M. Rasheed, San Jose, CA (US); Yu Lei, Belmont (CA); Avgerinos V. Gelatos, Redwood City, CA (US); Vikash Banthia, Los Altos, CA (US); Victor H. Calderon, Sunnyvale, CA (US); Shi Wei Toh, Sunnyvale, CA (US); Yung-Hsin Lee, San Jose, CA (US); Anindita Sen, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 203 days.

(21) Appl. No.: 16/249,716

(22) Filed: Jan. 16, 2019

(65) Prior Publication Data

US 2019/0229007 A1    Jul. 25, 2019

Related U.S. Application Data

(60) Provisional application No. 62/619,473, filed on Jan. 19, 2018.

(51) Int. Cl.
*H01L 21/687* (2006.01)
*H01J 37/32* (2006.01)
*H01L 21/683* (2006.01)

(52) U.S. Cl.
CPC .. *H01L 21/68735* (2013.01); *H01J 37/32715* (2013.01); *H01L 21/6831* (2013.01); *H01L 21/68757* (2013.01); *H01J 2237/3344* (2013.01)

(58) Field of Classification Search
CPC ......... H01L 21/68735; H01L 21/68757; H01L 21/6831; H01J 37/32715; H01J 2237/3344
See application file for complete search history.

(56) References Cited

U.S. PATENT DOCUMENTS

| | | | |
|---|---|---|---|
| 8,663,391 B2 * | 3/2014 | Matyushkin | H01L 21/6875 118/725 |
| 8,734,664 B2 | 5/2014 | Yang et al. | |
| 8,740,206 B2 * | 6/2014 | Arun | H01L 21/67069 451/41 |
| 8,900,405 B2 * | 12/2014 | Porshnev | H01J 37/32412 156/345.48 |
| 8,988,848 B2 * | 3/2015 | Todorow | H02N 13/00 361/234 |
| 9,412,555 B2 * | 8/2016 | Augustino | H01J 37/32715 |
| 10,017,857 B2 | 7/2018 | Nguyen et al. | |
| 10,177,050 B2 | 1/2019 | Sadjadi et al. | |
| 2007/0258186 A1 * | 11/2007 | Matyushkin | H01L 21/6875 361/234 |

(Continued)

*Primary Examiner* — Joel D Crandall
(74) *Attorney, Agent, or Firm* — Moser Taboada (57) ABSTRACT

Methods and apparatus for processing substrates are provided herein. In some embodiments, a process kit for a substrate support includes: an upper edge ring made of quartz and having an upper surface and a lower surface, wherein the upper surface is substantially planar and the lower surface includes a stepped lower surface to define a radially outermost portion and a radially innermost portion of the upper edge ring.

19 Claims, 7 Drawing Sheets

(56) References Cited

U.S. PATENT DOCUMENTS

| | | |
|---|---|---|
| 2013/0154175 A1 | 6/2013 | Todorow et al. |
| 2013/0288483 A1 | 10/2013 | Sadjadi et al. |
| 2016/0135252 A1* | 5/2016 | Matyushkin ...... H01L 21/67248 219/521 |
| 2017/0213753 A1 | 7/2017 | Rogers |

* cited by examiner

PROCESS KIT FOR A SUBSTRATE SUPPORT

CROSS-REFERENCE TO RELATED APPLICATIONS

This application claims benefit of U.S. provisional application Ser. No. 62/619,473, filed Jan. 19, 2018, which is herein incorporated by reference in its entirety.

FIELD

Embodiments of the present disclosure generally relate to substrate processing equipment, and more particularly, for process kits for a substrate support and methods of using same

BACKGROUND

Substrate processing systems, such as plasma reactors, may be used to deposit, etch, or form layers on a substrate or otherwise treat surfaces of the substrate. One technique useful for controlling aspects of such substrate processing is use of radio frequency (RF) energy to control a plasma proximate the substrate, such as by coupling RF energy to an electrode disposed beneath a substrate disposed on a substrate support.

The inventors provide herein embodiments of substrate processing systems that may provide improved RF energy control of the substrate processing system, and flexible control of plasma sheath at the vicinity of the wafer edge.

SUMMARY

Methods and apparatus for processing substrates are provided herein. In some embodiments, a process kit for a substrate support includes: an upper edge ring made of quartz and having an upper surface and a lower surface, wherein the upper surface is substantially planar and the lower surface includes a stepped lower surface to define a radially outermost portion and a radially innermost portion of the upper edge ring.

In some embodiments, a substrate support includes: a lower edge ring, wherein the lower edge ring is conductive, and an upper edge ring having a contoured lower surface configured to interface with the lower edge ring, the upper edge ring further having an inner diameter that is less than that of the lower edge ring and an outer diameter that is greater than that of the lower edge ring, the upper edge ring further having an upper surface that is substantially planar, wherein the upper edge ring is fabricated from quartz.

In some embodiments, a substrate support includes a base supporting a substrate support surface configured to support a substrate having a given diameter; and a process kit disposed atop the substrate support and comprising: a lower edge ring having an upper surface positioned at a height above the upper surface of the base and below the substrate support surface; and an upper edge ring disposed atop the lower edge ring, the upper edge ring having an inner diameter that is less than the given diameter and an outer diameter that is greater than that of the base, the upper edge ring further having an upper surface that is substantially planar.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods and apparatus for processing substrates are disclosed herein. The inventive methods and apparatus may advantageously facilitate more uniform plasma processing of substrates as compared to conventional plasma processing apparatus. For example, embodiments of the disclosure may improve processing uniformity, such as etch uniformity as compared between the edge of the substrate and the center of the substrate, thus providing more uniform substrate processing overall.

For example, the inventors have discovered that center-to-edge non-uniform etch amount is found during certain etch processes on a substrate, such as a semiconductor wafer. In particular, the inventors have discovered that the substrate edge acts as an RF antenna, causing the electric field in the process chamber to be localized and attracted by the substrate edge during processes applying RF bias. Hence, plasma striking on the substrate edge will also become localized and stronger. The inventors have discovered inventive edge ring designs that including two edge ring components: an upper edge ring and a lower edge ring, as discussed in greater detail below. The upper edge ring is fabricated from quartz, which has a higher etch resistance and produces less defects/particles inside the chamber during processing. The lower edge ring can made of conductive materials or high-permittivity materials, such as aluminum. The conductive or high-permittivity lower edge ring raises the RF conductive surface and changes the electric field near the edge of the substrate. Such change in the electric field advantageously shifts plasma striking from the edge of the substrate to the upper edge ring disposed above the lower edge ring.

Figure 1:
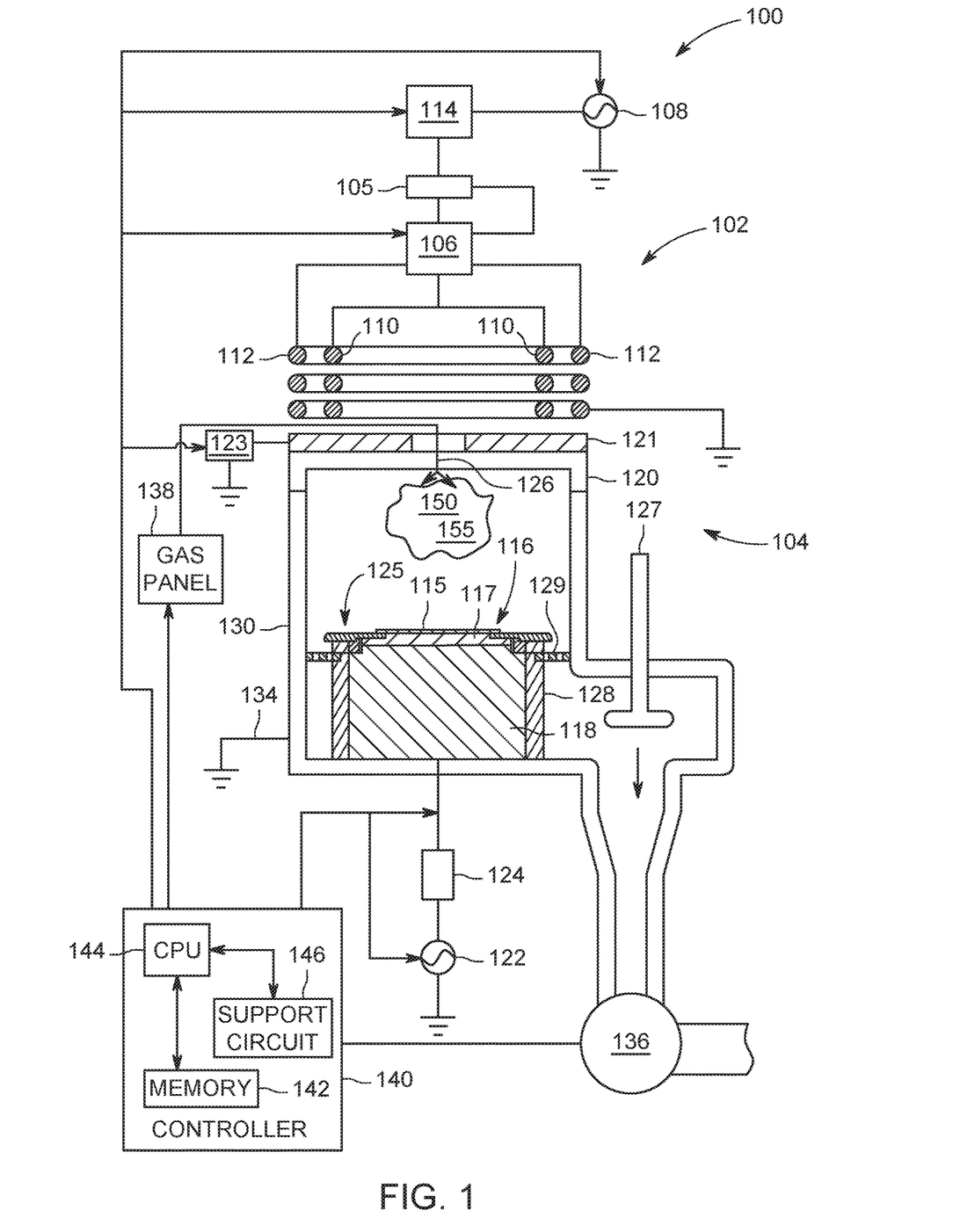
FIG. 1 depicts schematic view of a plasma reactor in accordance with some embodiments of the present disclosure.

FIG. 1 depicts a schematic side view of an inductively coupled plasma reactor (reactor 100) in accordance with some embodiments of the present disclosure. The reactor 100 may be utilized alone or, as a processing module of an integrated semiconductor substrate processing system, or cluster tool, such as a CENTURA® integrated semiconductor wafer processing system, available from Applied Materials, Inc. of Santa Clara, Calif. Examples of suitable plasma reactors that may advantageously benefit from modification in accordance with embodiments of the present disclosure include inductively coupled plasma etch reactors such as the DPS® line of semiconductor equipment or other inductively coupled plasma reactors, such as MESA™ or the like also available from Applied Materials, Inc. The above listing of semiconductor equipment is illustrative only, and other etch reactors, and non-etch equipment (such as CVD reactors, or other semiconductor processing equipment) may also be suitably modified in accordance with the present teachings. For example, suitable non-limiting plasma reactors that may be modified in accordance with the present disclosure may be found in United States Patent Application Publication number 2011/009499, published Apr. 28, 2011 to V. Todorow, et al., and entitled, "INDUCTIVELY COUPLED PLASMA APPARATUS;" United States Patent Application Publication number 2011/0097901, published Apr. 28, 2011 to S. Banna, et al., and entitled, "DUAL MODE INDUCTIVELY COUPLED PLASMA REACTOR WITH ADJUSTABLE PHASE COIL ASSEMBLY;" or United States Patent Application Publication number 2015/0068682, published May 12, 2015 to S. Banna, et al., and entitled, "POWER DEPOSITION CONTROL IN INDUCTIVELY COUPLED PLASMA (ICP) REACTORS."

The reactor 100 generally includes a process chamber 104 having a conductive body (chamber wall 130) and a lid 120 (e.g., a ceiling) that together define an inner volume, a substrate support 116 disposed within the inner volume (shown supporting a substrate 115), an inductively coupled plasma apparatus 102, and a controller 140. The chamber wall 130 is typically coupled to an electrical ground 134. In embodiments where the reactor 100 is configured as an inductively coupled plasma reactor, the lid 120 may comprise a dielectric material facing the inner volume of the reactor 100. In other embodiments, other plasma sources may also or alternatively be used, such as capacitively coupled plasma source, remote plasma sources, or the like.

Figure 2:
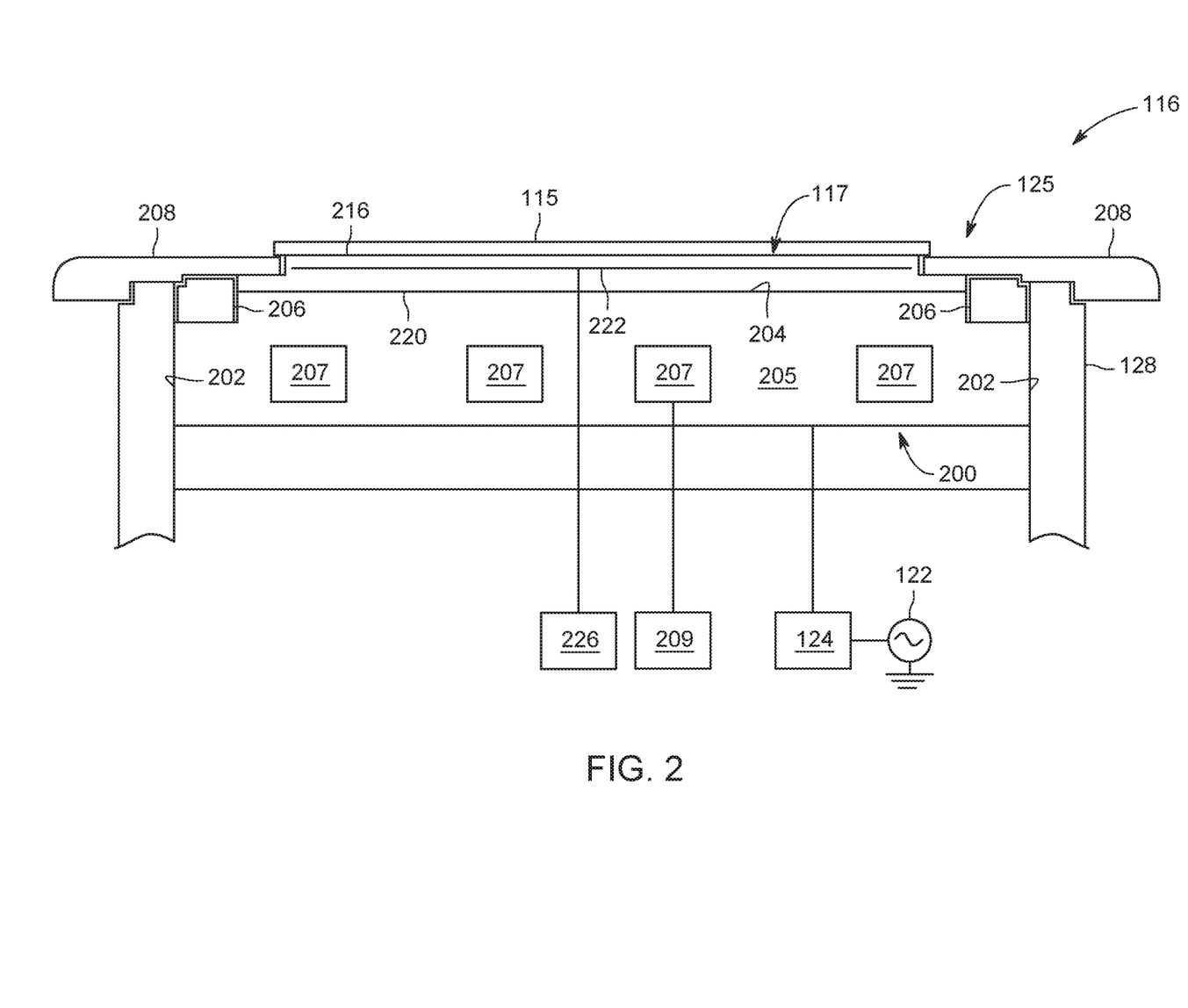
FIG. 2 depicts a schematic side view of a substrate support in accordance with some embodiments of the present disclosure.

The substrate support 116 generally includes an upper portion having a support surface for supporting the substrate 115. In some embodiments, the support surface is formed from a dielectric material. FIG. 1 shows the upper portion of the substrate support 116, for example, as an electrostatic chuck 117. The substrate support 116 further includes a cathode 118 coupled through a matching network 124 to a bias source 122. The bias source 122 may illustratively be a source of up to about 1000 W (but not limited to about 1000 W) of RF energy, such as about 150 W for certain applications, at a frequency of, for example, approximately 13.56 MHz, although other frequencies and powers may be provided as desired for particular applications. The bias source 122 may be capable of producing either or both of continuous or pulsed power. In some embodiments, the bias source 122 may be a DC or pulsed DC source. In some embodiments, the bias source 122 may be capable of providing multiple frequencies, or one or more second bias sources (as illustrated in FIG. 2) may be coupled to the substrate support 116 through the same matching network 124 or through one or more additional matching networks (as illustrated in FIG. 2) to provide multiple frequencies. An insulator layer 128 surrounds the cathode 118.

A process kit 125 is disposed atop the substrate support 116 to protect upper surfaces of the substrate support 116 that would otherwise be exposed. The process kit 125 is further configured to improve substrate processing, as discussed in greater detail, below. In some embodiments, a plasma screen 129 may be disposed in a region between the substrate support 116 and the chamber wall 130 to limit or prevent plasma from moving below the substrate support 116.

FIG. 2 depicts further detail of the substrate support 116 in accordance with some embodiments of the present disclosure. As shown in FIG. 2, the substrate support 116 includes an electrode 200 (e.g., the cathode 118) disposed within the substrate support 116. In some embodiments, the electrode 200 may be centrally disposed beneath the support surface 216 of the substrate support 116. The electrode 200 is formed of a conductive material, such as one or more of aluminum (Al), doped silicon carbide (SiC), or other suitable conductive materials compatible with process environment. In some embodiments, the electrode 200 may be disposed in, or may be, a base 205 that supports the dielectric support surface of the substrate support 116. The base 205 may have a peripheral edge 202 and an upper surface 204. In some embodiments, the base 205 may include a plurality of channels 207 disposed through the base 205 to flow a heat transfer medium through the channels 207. A heat transfer medium source 209 may be coupled to the plurality of channels 207 to provide a heat transfer medium to the plurality of channels 207. For example, the flow of the heat transfer medium through the plurality of channels 207 may be used to regulate the temperature of a substrate disposed on the substrate support 116.

The substrate support 116 further includes a substrate support surface 216 disposed above the upper surface 204 of the electrode 200. For example, the substrate support surface 216 may be part of the electrostatic chuck 117. The electrostatic chuck 117 is disposed above the electrode 200 and the substrate support surface 216 is an upper surface of the electrostatic chuck 117. The electrostatic chuck 117 may include a dielectric plate, such as a ceramic puck 220. The ceramic puck 220 includes one or more electrodes (electrode 222 shown) disposed therein to provide DC energy for chucking a substrate 115 to the electrostatic chuck 117. The electrode 222 is typically coupled to a DC power supply 226.

A process kit (e.g., the process kit 125) is disposed atop the substrate support 116 to protect upper surfaces of the substrate support 116 that would otherwise be exposed. For example, the process kit 125 includes a lower edge ring 206 and an upper edge ring 208. The lower edge ring 206 is fabricated from conductive or high-permittivity process-compatible materials, such as aluminum or an aluminum alloy, for example Al6061. The lower edge ring 206 is electrically coupled to the electrode 200 (e.g., the base 205) such that the electrode 200 and the lower edge ring 206 may be coupled to a common RF power supply (e.g., bias source 122). In some embodiments, the lower edge ring 206 is fabricated from the same conductive material as the base 205, which, in some embodiments, is Al6061. The lower edge ring 206 generally includes curved edges to avoid arcing. The upper edge ring 208 is fabricated from an insulative process-compatible material, such as quartz. The insulator layer 128 that surrounds the cathode 118 (e.g., the electrode 200, or base 205) is also disposed around the outer diametral surface of the lower edge ring 206. The upper edge ring 208 is disposed over the insulator layer 128, the lower edge ring 206, and a portion of the ceramic puck 220, as discussed in greater detail below.

The inventors have observed that, during plasma processing, the edge of the substrate 115 can act as an RF antenna, causing the electric field in the process chamber to be localized and attracted by the substrate edge during processes applying RF bias. Hence, plasma striking on the substrate edge also becomes localized and stronger, resulting in non-uniform substrate processing. For example, the inventors have discovered that center-to-edge non-uniformity in etch amount is found during certain etch processes on a substrate, such as a semiconductor wafer.

The conductive or high-permittivity lower edge ring 206 raises the RF conductive surface and changes the electric field near the edge of the substrate 115. Such change in the electric field advantageously shifts plasma striking from the edge of the substrate 115 to the upper edge ring 208 disposed above the lower edge ring 206. The upper edge ring 208 is fabricated from quartz, which advantageously has a higher etch resistance and produces less defects/particles inside the chamber during processing. Thus, the inventors have discovered that providing the process kit 125, as discussed herein, can advantageously provide more uniform substrate processing, such as etching, while at the same time producing less defects/particles inside the chamber during processing.

Figure 3:
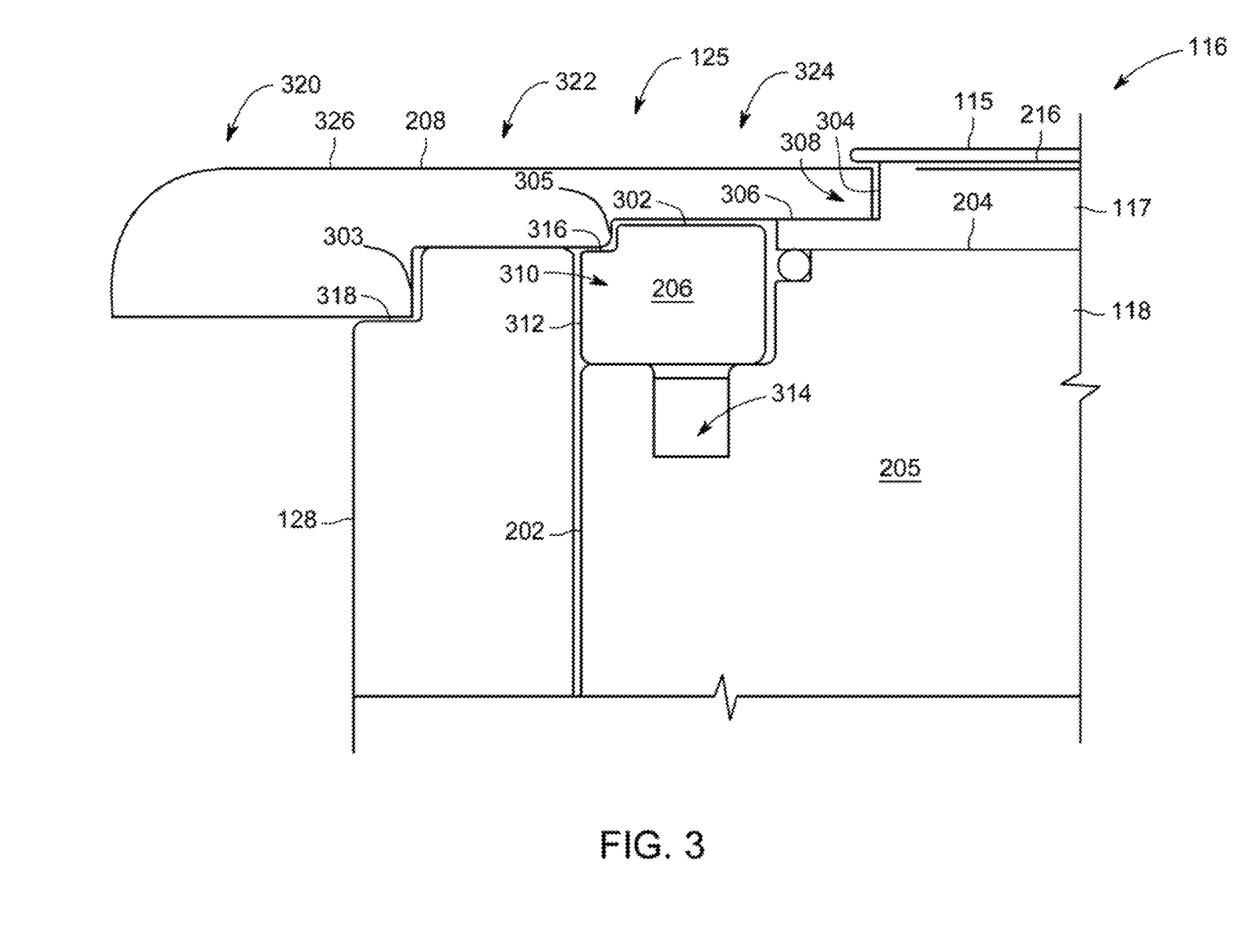
FIG. 3 depicts a partial schematic side view of a substrate support in accordance with some embodiments of the present disclosure.

FIG. 3 depicts a partial schematic side view of the substrate support 116 depicted in FIG. 2, in accordance with some embodiments of the present disclosure. For example, the electrostatic chuck 117 is configured to support a substrate having a given diameter, such as 300 mm (although other sizes and shapes, such as 150 mm, 200 mm, 450 mm, or the like, can also be utilized). The support surface 216 of the electrostatic chuck 117 has a diameter less than the given width, such that the outer peripheral edge of the substrate 115 slightly overhangs the support surface 216. For example, in a configuration for processing a 300 mm wafer, the support surface 216 has a diameter that is slightly less than 300 mm. The electrostatic chuck 117 includes a wall 304 that is vertical or substantially vertical extending downward from the support surface 216, terminating at an upper surface 306 of an outer peripheral ledge 308 that extends radially outward from the bottom of the wall 304.

The lower edge ring 206 is disposed radially outward of the outer peripheral ledge 308 of the electrostatic chuck 117. For example, the inner diameter of the lower edge ring 206 is greater than that of the outer peripheral ledge 308, and thus, of the given width of the substrate (for example, 300 mm). As noted above, the lower edge ring 206 is conductively coupled to the electrode 200. As depicted in FIG. 3, the lower edge ring 206 is conductively coupled to the electrode 200, for example, by being disposed directly atop the base 205 (which forms the electrode 200). The lower edge ring 206 includes an upper surface 302 that is positioned above the upper surface 204 of the base 205 (e.g., above the electrode 200) to locally raise the RF conductive surface in a region disposed radially outward of the outer edge of the substrate 115.

The inventors have discovered that positioning the upper surface 302 of the lower edge ring 206 above the upper surface 204 of the electrode 200 advantageously provides more uniform substrate processing, as noted above. For example, the inventors believe that the raised upper surface 302 of the lower edge ring 206 attracts ions outside of the diameter of the substrate 115, preventing or reducing the increased processing results at the substrate edge.

However, the inventors have further discovered that, for some processes, positioning upper surface 302 of the lower edge ring 206 too close to or above the substrate 115 dramatically reduces the processing rate, such as the etch rate, proximate the edge of the substrate 115. As such, in some embodiments, the upper surface 302 of the lower edge ring 206 is further disposed at a height below the upper surface 306 of the outer peripheral ledge 308.

In some embodiments, the base 205 includes a cutout or notch 310 configured to receive the lower edge ring 206. In some embodiments, a radially inner wall of the notch 310 is substantially aligned with the outer wall of the outer peripheral ledge 308. As depicted in FIG. 3, the notch 310 and the lower edge ring 206 are sized to position the upper surface 302 of the lower edge ring 206 both above the upper surface 204 of the base 205 and below the upper surface 306 of the outer peripheral ledge 308. In some embodiments, the lower edge ring 206 has an inner diameter that is greater than that of the radially inner wall of the notch 310 such that the inner sidewall of the lower edge ring does not contact the radially inner wall of the notch 310. In some embodiments, the lower edge ring 206 has an outer diameter that is equal to or less than that of the base 205. In other words, a peripheral edge 312 of the lower edge ring is aligned with or disposed radially inward of the peripheral edge 202.

In some embodiments, either or both of the lower edge ring 206 or the base 205 can include one or more alignment features to facilitate radial alignment of the lower edge ring 206 to the base 205. For example, as depicted in FIG. 3, a hole 314 can be disposed in the notch 310 of the base 205 to receive a corresponding protrusion or pin of the lower edge ring 206 (not shown) to facilitate radial alignment of the lower edge ring 206 to the base 205. Other alignment configurations are also contemplated.

The upper edge ring 208 is disposed over the insulator layer 128, the lower edge ring 206, and a portion of the outer peripheral ledge 308 of the ceramic puck 220. Specifically, the upper edge ring 208 has a lower surface configured to rest at least on the outer peripheral ledge 308. The lower surface of the upper edge ring 208 is slightly spaced apart from the upper surface 302 of the lower edge ring 206. The lower surface of the upper edge ring 208 may also rest on the upper surface of the insulator layer 128.

In some embodiments, the lower edge ring 206 can include an upper and outer peripheral notch 316 configured to interface with a corresponding portion of the upper edge ring 208. The notch 316 facilitates alignment of the lower edge ring 206 and the upper edge ring 208. In some embodiments, the lower edge ring does not include an upper and outer peripheral notch, for example as described below with respect to FIGS. 6-6A.

In some embodiments, the insulator layer 128 can include an upper and outer peripheral notch 318 configured to interface with a corresponding portion of the upper edge ring 208. The upper edge ring 208 can include a contoured lower surface, such as a stepped lower surface. In some embodiments the upper edge ring 208 includes a stepped lower surface having one or more steps that progressively reduce the thickness of the upper edge ring 208 from a thickest radially outermost portion (excluding the rounded edge) to a thinnest radially innermost portion.

Figure 7:
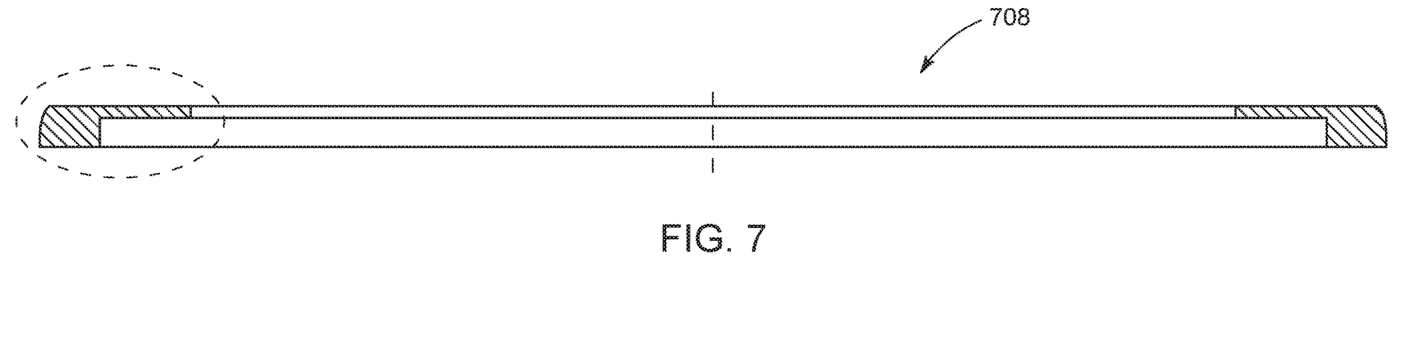
FIG. 7 depicts a side cross-sectional view of an upper edge ring in accordance with some embodiments of the present disclosure.
Figure 7A:
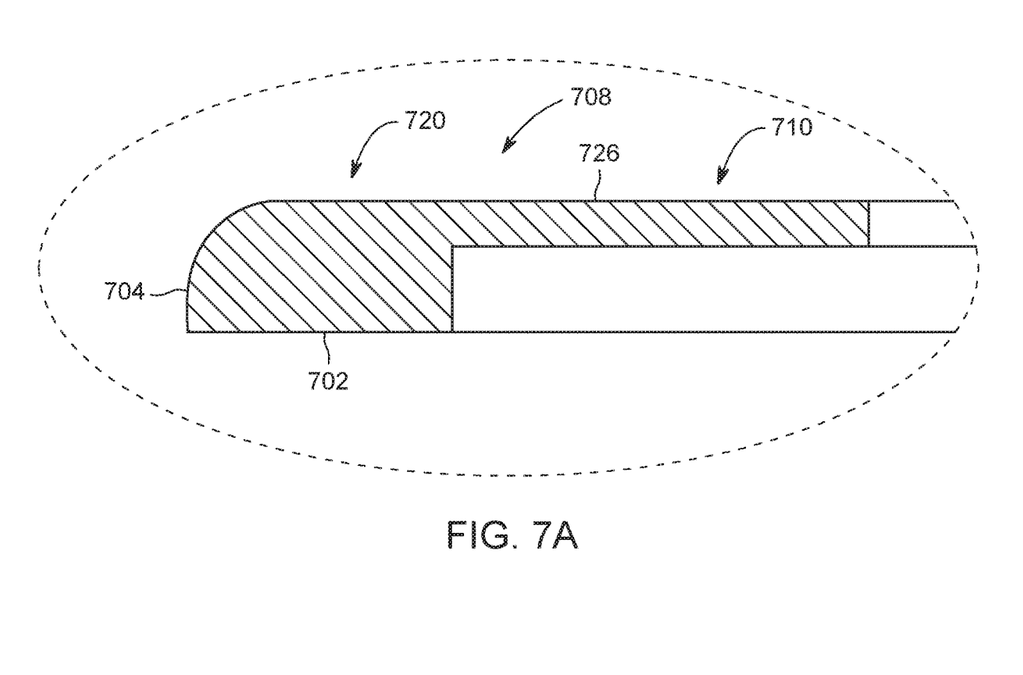
FIG. 7A depicts a partial side cross-sectional view of the upper edge ring of FIG. 7.

For example, in some embodiments, and as depicted in FIG. 1 and FIGS. 7 and 7A, one step is provided, defining two portions having different thicknesses: a radially outermost portion (e.g., 720 in FIG. 7A) and a radially innermost portion (e.g., 710 in FIG. 7A). In some embodiments, and as depicted in FIGS. 2-3 and FIGS. 5-5A, two steps (a first step 303 and a second step 305) are provided, defining three portions having different thicknesses: a radially outermost portion 320, a central portion 322, and a radially innermost portion 324. The one or more steps can be positioned to interface the upper edge ring 208 with components disposed below the outer peripheral ledge 308, the notch 316, and the notch 318.

The upper edge ring 208 includes an upper surface 326 and a radiused or curved upper peripheral edge connecting the upper surface 326 to an outer peripheral wall of the upper edge ring 208 or directly to the lower surface of the upper edge ring 208, depending upon the nature of the curve. In some embodiments, the upper surface 326 is planar or substantially planar from the inner diameter of the upper edge ring 208 to proximate the outer diameter of the upper edge ring 208 (e.g., excluding the curved upper peripheral edge of the upper edge ring).

The upper edge ring 208 has an inner diameter that is greater than that of the support surface 216 and less than the given diameter of the substrate 115 (e.g., less than 300 mm for configurations designed for processing 300 mm wafers). An inner surface of the upper edge ring 208 may extend at a constant diameter from the upper surface 326 to the lower surface of the upper edge ring 208. A gap may be defined between the upper edge ring 208 and the wall 304. The upper edge ring 208 further has a thickness at the radially innermost portion 324 that is less than the height of the wall 304, such that when the upper edge ring 208 is resting on the outer peripheral ledge 308, the upper surface 326 of the upper edge ring 208 is lower than the support surface 216 of the electrostatic chuck 117. The inventors have discovered that positioning the upper surface 326 at or above the level of the substrate 115 increases particle defects during certain processes, such as etching. Thus, when the substrate 115 is disposed on the substrate support 116, the radially innermost portion 324 of the upper edge ring 208 extends beneath the outer peripheral edge of the substrate 115 and a gap is defined between the upper edge ring 208 and the backside surface of the substrate 115.

The upper edge ring 208 has an outer diameter that is greater than that of the substrate support 116, such that the outer peripheral edge of the upper edge ring overhangs or extends beyond the substrate support 116 (including insulator layer 128).

Figure 4:
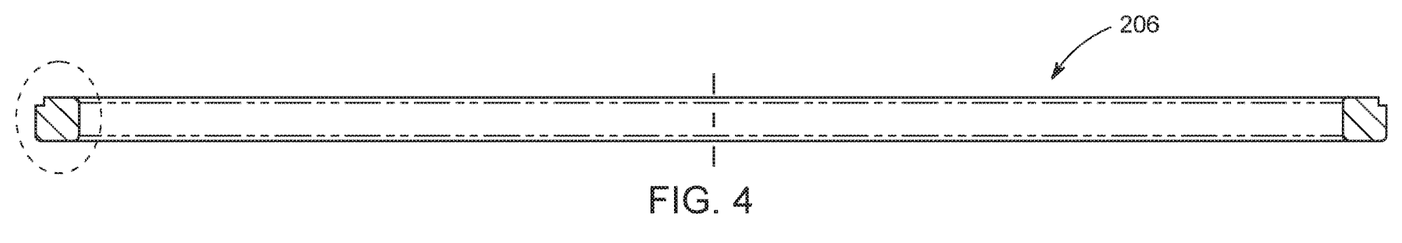
FIG. 4 depicts a side cross-sectional view of a lower edge ring for a substrate support in accordance with some embodiments of the present disclosure.
Figure 4A:
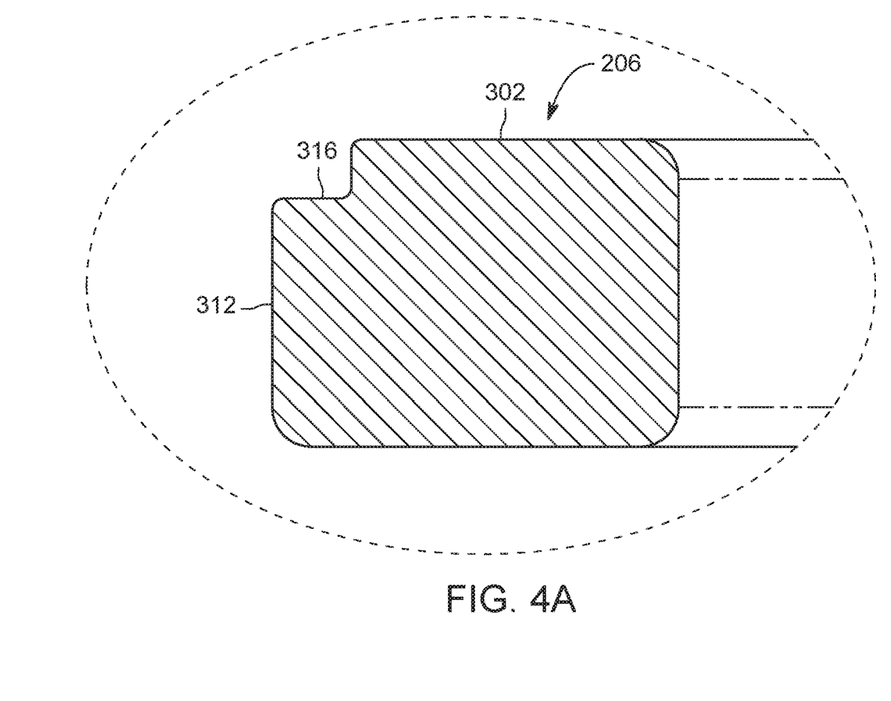
FIG. 4A depicts a partial side cross-sectional view of the lower edge ring of FIG. 4.

FIG. 4 depicts a side cross-sectional view of the lower edge ring 206 in accordance with some embodiments of the present disclosure. FIG. 4A depicts a partial side cross-sectional view of the lower edge ring 206.

Figure 5:
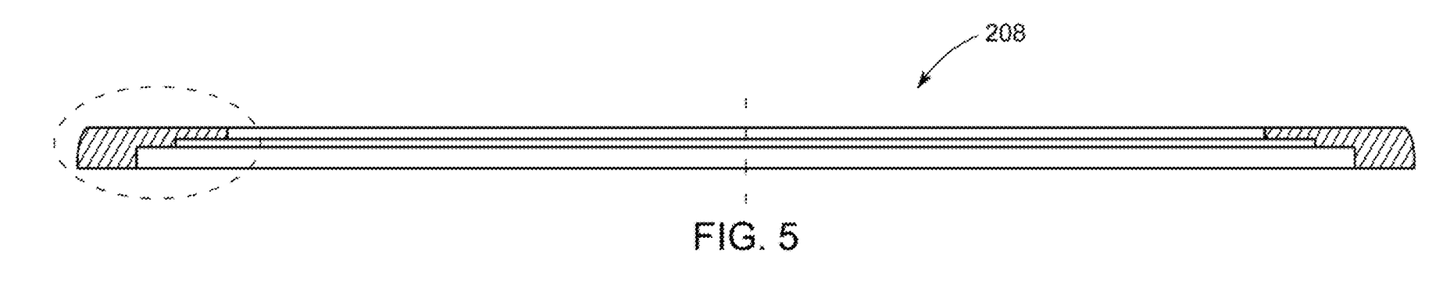
FIG. 5 depicts a side cross-sectional view of an upper edge ring for a substrate support in accordance with some embodiments of the present disclosure.
Figure 5A:
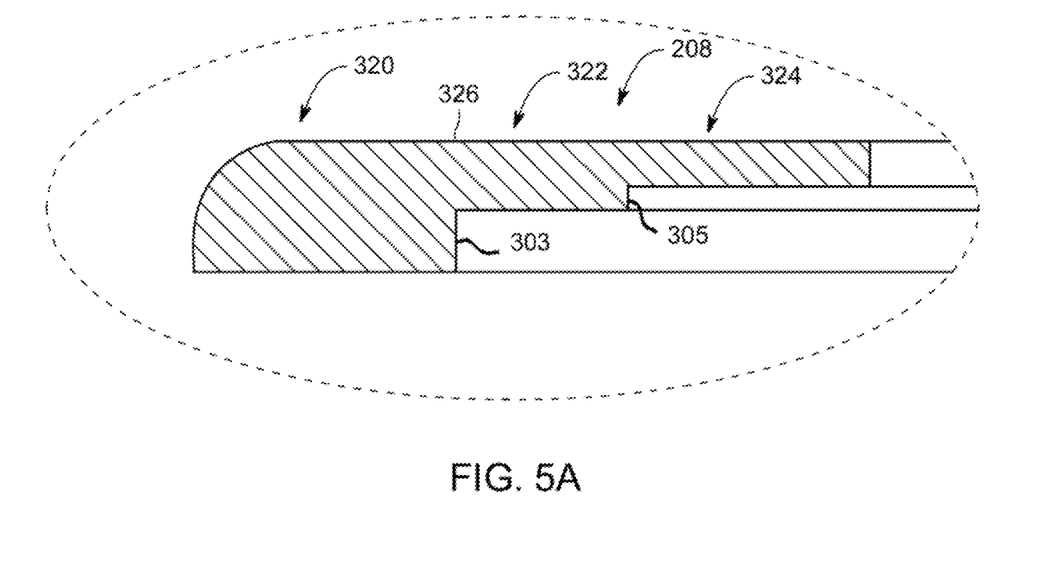
FIG. 5A depicts a partial side cross-sectional view of the upper edge ring of FIG. 5.

FIG. 5 depicts a side cross-sectional view of the upper edge ring 208 in accordance with some embodiments of the present disclosure. FIG. 5A depicts a partial side cross-sectional view of the upper edge ring 208.

Figures 6, 6A:
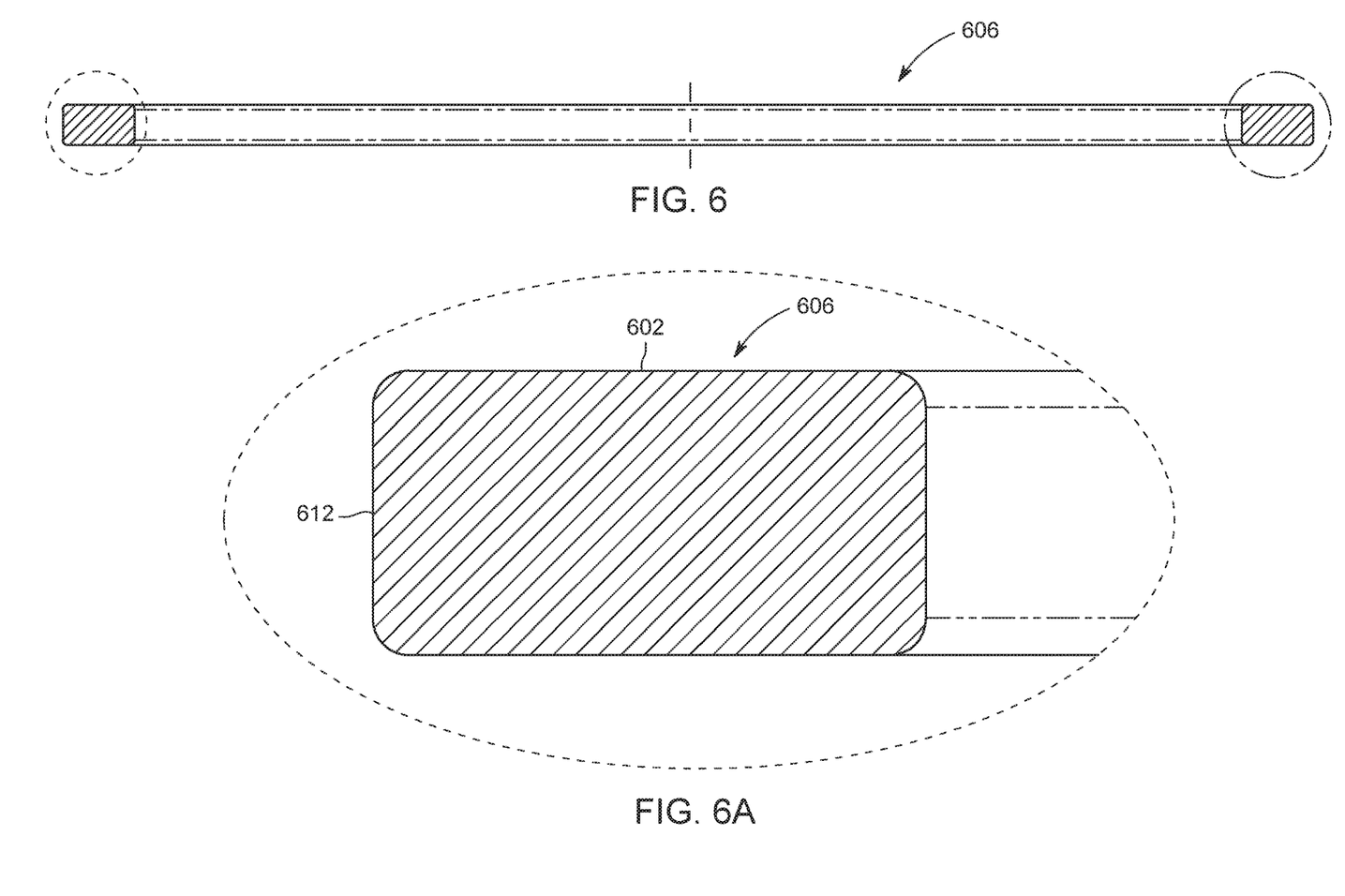
FIG. 6 depicts a side cross-sectional view of a lower edge ring in accordance with some embodiments of the present disclosure.
FIG. 6A depicts a partial side cross-sectional view of the lower edge ring of FIG. 6.

FIG. 6 depicts a side cross-sectional view of a lower edge ring 606 in accordance with some embodiments of the present disclosure. FIG. 6A depicts a partial side cross-sectional view of the lower edge ring 606. The lower edge ring 606 can be used as the lower edge ring similar as described above. The lower edge ring 606 has an upper surface 602 and a peripheral sidewall 612. In some embodiments, the lower edge ring 608 has an outer diameter of about 13.2 inches to about 13.8 inches. In some embodiments, the lower edge ring 608 has an inner diameter of about 12.0 inches to about 12.5 inches. In some embodiments, the lower edge ring 606 generally includes curved edges.

FIG. 7 depicts a side cross-sectional view of an upper edge ring 708 in accordance with some embodiments of the present disclosure. FIG. 7A depicts a partial side cross-sectional view of the upper edge ring 708. The upper edge ring 708 can be used as the upper edge ring similar as described above. The upper edge ring 708 includes an upper surface 726 and a radiused or curved upper peripheral edge connecting the upper surface 726 to an outer peripheral wall 704 of the upper edge ring 708 or directly to the lower surface 702 of the upper edge ring 708, depending upon the nature of the curve. In some embodiments, the upper surface 726 is planar or substantially planar from an inner diameter of the upper edge ring 708 to proximate the outer diameter of the upper edge ring 708 (e.g., excluding the curved upper peripheral edge of the upper edge ring).

The upper edge ring 708 has an inner diameter that is greater than that of the support surface 216 and less than the given diameter of the substrate 115. An inner surface of the upper edge ring 708 may extend at a constant diameter from the upper surface 726 to the lower surface 702 of the upper edge ring 708. In some embodiments, the inner diameter of the upper edge ring 708 is about 11.5 inches to about 12.0 inches. In some embodiments, the outer diameter of the upper edge ring 708 is about 14.9 inches to about 15.4 inches. In some embodiments, the upper edge ring 708 has a width, as defined by a distance between the inner diameter of the upper edge ring 708 and the outer diameter of the upper edge ring 708, of about 1.5 inches to about 2.0 inches.

The upper edge ring 708 includes a lower surface 702 that is contoured, such as a stepped lower surface. As depicted in FIG. 7, the upper edge ring 708 includes a stepped lower surface that reduces the thickness of the upper edge ring 708 from a thicker radially outermost portion (excluding the rounded edge) to a thinner radially innermost portion. In the embodiment of FIGS. 7-7A, one step is provided, defining two portions having different thicknesses: a radially outermost portion 720 and a radially innermost portion 710. In some embodiments, the radially innermost portion 710 has an outer diameter of about 13.5 inches to about 14.5 inches. The step can be positioned to interface the upper edge ring 708 with the outer peripheral ledge 308 and the lower edge ring 206 or the lower edge ring 608.

Returning to FIG. 1, in some embodiments, the lid 120 may be substantially flat. Other modifications of the process chamber 104 may have other types of lids such as, for example, a dome-shaped lid or other shapes. The inductively coupled plasma apparatus 102 is typically disposed above the lid 120 and is configured to inductively couple RF power into the process chamber 104. The inductively coupled plasma apparatus 102 includes the first and second coils 110, 112, disposed above the lid 120. The relative position, ratio of diameters of each coil, and/or the number of turns in each coil can each be adjusted as desired to control, for example, the profile or density of the plasma being formed via controlling the inductance on each coil. Each of the first and second coils 110, 112 is coupled through a matching network 114 via the RF feed structure 106, to the RF power supply 108. The RF power supply 108 may illustratively be capable of producing up to about 4000 W (but not limited to about 4000 W) at a tunable frequency in a range from 50 kHz to 13.56 MHz, although other frequencies and powers may be provided as desired for particular applications.

In some embodiments, a power divider 105, such as a dividing capacitor, may be provided between the RF feed structure 106 and the RF power supply 108 to control the relative quantity of RF power provided to the respective first and second coils. For example, as shown in FIG. 1, the power divider 105 may be disposed in the line coupling the RF feed structure 106 to the RF power supply 108 for controlling the amount of RF power provided to each coil (thus facilitating control of plasma characteristics in zones corresponding to the first and second coils). In some embodiments, the power divider 105 may be incorporated into the match network 114. In some embodiments, after the power divider 105, RF current flows to the RF feed structure 106, then to the first and second coils 110, 112. Alternatively, the split RF current may be fed directly to each of the respective first and second RF coils.

A heater element 121 may be disposed atop the lid 120 to facilitate heating the interior of the process chamber 104. The heater element 121 may be disposed between the lid 120 and the first and second coils 110, 112. In some embodiments, the heater element 121 may include a resistive heating element and may be coupled to a power supply 123, such as an AC power supply, configured to provide sufficient energy to control the temperature of the heater element 121 to be between about 50 to about 100 degrees Celsius. In some embodiments, the heater element 121 may be an open break heater. In some embodiments, the heater element 121 may comprise a no break heater, such as an annular element, thus facilitating uniform plasma formation within the process chamber 104.

During operation, the substrate 115 (such as a semiconductor wafer or other substrate suitable for plasma processing) may be placed on the substrate support 116 and process gases may be supplied from a gas panel 138 through one or more entry ports 126 disposed through the lid 120 and/or the chamber wall 130 to form a gaseous mixture 150 within the process chamber 104. For example, prior to introduction of the process gases, a temperature of surfaces within the chamber may be controlled, for example, by the heater 121 as discussed above to have inner volume facing surfaces at a temperature of between about 100 to 200 degrees Celsius, or about 150 degrees Celsius. The gaseous mixture 150 may be ignited into a plasma 155 in the process chamber 104 by applying power from the RF power supply 108 to the first and second coils 110, 112. In some embodiments, power from the bias source 122 may be also provided to the substrate support 116. The pressure within the interior of the process chamber 104 may be controlled using a throttle valve 127 and a vacuum pump 136. In some embodiments, the pressure within the process chamber 104 may be controlled using a gate valve, a butterfly valve, a pendulum valve, or the like. The temperature of the chamber wall 130 may be controlled using liquid-containing conduits (not shown) that run through the chamber wall 130. One non-limiting particular application where the present apparatus is found to be particularly useful is a pre-clean application, such as etching an oxide, such as silicon oxide, from a substrate, such as a silicon substrate or wafer.

The controller 140 comprises a central processing unit (CPU) 144, a memory 142, and support circuits 146 for the CPU 144 and facilitates control of the components of the reactor 100 and, as such, of methods of forming a plasma, such as discussed herein. The controller 140 may be any form of general-purpose computer processor that can be used in an industrial setting for controlling various chambers and sub-processors. The memory, or computer-readable medium, 142 of the CPU 144 may be one or more of readily available memory such as random access memory (RAM), read only memory (ROM), floppy disk, hard disk, or any other form of digital storage, local or remote. The support circuits 146 are coupled to the CPU 144 for supporting the processor in a conventional manner. These circuits include cache, power supplies, clock circuits, input/output circuitry and subsystems, and the like. The memory 142 stores software (source or object code) that may be executed or invoked to control the operation of the reactor 100 in the manner described herein. The software routine may also be stored and/or executed by a second CPU (not shown) that is remotely located from the hardware being controlled by the CPU 144.

While the foregoing is directed to embodiments of the present disclosure, other and further embodiments of the disclosure may be devised without departing from the basic scope thereof. For example, at different RF frequencies for the RF bias applied to the electrode 200, and/or at different power levels, various dimensions of the process kit 125 may be controlled to position the upper surface 302 (or 602) of the lower edge ring 206 (or 606). For example, in some embodiments, the upper surface 302 (or 602) of the lower edge ring 206 (or 606) may be positioned closer to or further from the support surface 216. In some embodiments, the inner and/or outer diameter of the lower edge ring 206 (or 606) may be selected or controlled to control the width of the upper surface 302 (or 602) and/or to control the radial position of the upper surface 302 (or 602) of the lower edge ring 206 (or 606).

The invention claimed is:

1. A process kit for a substrate support, comprising:
   an upper edge ring made of quartz and having an upper surface and a lower surface, wherein the upper surface is substantially planar and the lower surface includes a stepped lower surface having a first step that defines a radially outermost portion of the upper edge ring and having a second step that defines a radially innermost portion of the upper edge ring, the upper edge ring having a central portion extending between and spacing the radially outermost portion and the radially innermost portion, and wherein an inner surface of the upper edge ring extends at a constant diameter from the upper surface to the lower surface; and
   a lower edge ring, wherein the lower edge ring is radially spaced from the first step of the stepped lower surface and the lower edge ring is configured to interface with the second step of the stepped lower surface of the upper edge ring.

2. The process kit of claim 1, wherein the lower edge ring has a notch along an upper and outer peripheral edge, wherein the second step of the stepped lower surface of the upper edge ring is configured to interface with the notch.

3. The process kit of claim 1, wherein the upper edge ring has an inner diameter that is less than an inner diameter of the lower edge ring and an outer diameter that is greater than an outer diameter of the lower edge ring.

4. The process kit of claim 1, wherein the lower edge ring is electrically conductive.

5. The process kit of claim 1, wherein the radially outermost portion has a thickness greater than a thickness of the radially innermost portion.

6. The process kit of claim 1, wherein the upper edge ring includes a curved upper peripheral edge connecting the upper surface to an outer peripheral wall of the upper edge ring or to the lower surface of the upper edge ring.

7. The process kit of claim 1, wherein the upper edge ring has a width of about 1.5 inches to about 2.0 inches.

8. The process kit of claim 1, wherein the radially innermost portion of the upper edge ring has an outer diameter of about 13.5 inches to about 14.5 inches.

9. A substrate support, comprising:
a base supporting a substrate support surface configured to support a substrate having a given diameter; and
the process kit of claim 1 disposed atop the substrate support, wherein:
the lower edge ring has an upper surface positioned at a height above the upper surface of the base and below the substrate support surface; and
the upper edge ring has an inner diameter that is less than the given diameter and an outer diameter that is greater than that of the base.

10. The substrate support of claim 9, further comprising:
an upper portion of the substrate support disposed above the base, wherein an upper surface of the upper portion of the substrate support comprises the substrate support surface.

11. The substrate support of claim 10, wherein the upper portion of the substrate support includes an outer peripheral ledge extending radially outward, and wherein the lower surface of the upper edge ring is configured to rest at least on the outer peripheral ledge.

12. The substrate support of claim 9, wherein the lower edge ring includes curved edges.

13. A process kit for a substrate support, comprising:
a lower edge ring, wherein the lower edge ring is electrically conductive, and has a rectangular cross-sectional shape with an upper and outer peripheral notch; and
an upper edge ring having a contoured lower surface configured to interface with the lower edge ring, the upper edge ring further having an inner diameter that is less than an inner diameter of the lower edge ring and an outer diameter that is greater than an outer diameter of the lower edge ring, the upper edge ring further having an upper surface that is substantially planar, wherein the upper edge ring is fabricated from quartz, and wherein the contoured lower surface of the upper edge ring includes a stepped lower surface that generally reduces a thickness of the upper edge ring from a radially outermost portion to a radially innermost portion.

14. The process kit of claim 13, wherein the contoured lower surface of the upper edge ring includes a stepped lower surface that generally reduces a thickness of the upper edge ring from a radially outermost portion to a radially innermost portion.

15. The process kit of claim 14, wherein the stepped lower surface includes one step to define the radially outermost portion and the radially innermost portion.

16. The process kit of claim 15, wherein the radially innermost portion of the upper edge ring is configured to interface with the lower edge ring.

17. The process kit of claim 13, wherein the lower edge ring is made of aluminum or an aluminum alloy.

18. The process kit of claim 13, wherein the lower edge ring has the notch along an upper and outer peripheral edge, wherein the contoured lower surface of the upper edge ring is configured to interface with the notch.

19. The process kit of claim 13, wherein the upper edge ring includes a curved upper peripheral edge connecting the upper surface to an outer peripheral wall of the upper edge ring or to the contoured lower surface of the upper edge ring.

\* \* \* \* \*